(12) United States Patent
Perroni et al.

(10) Patent No.: US 8,441,863 B2
(45) Date of Patent: May 14, 2013

(54) NON-VOLATILE MEMORY DEVICE WITH RECONNECTION CIRCUIT

(75) Inventors: Maurizio Francesco Perroni, Furnari (IT); Giuseppe Castagna, Palermo (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 158 days.

(21) Appl. No.: 13/156,356

(22) Filed: Jun. 9, 2011

(65) Prior Publication Data
US 2011/0305094 A1    Dec. 15, 2011

(30) Foreign Application Priority Data

Jun. 15, 2010   (IT) .............................. MI2010A1081

(51) Int. Cl.
*G11C 11/34*   (2006.01)
*G11C 16/04*   (2006.01)
*G11C 7/06*    (2006.01)

(52) U.S. Cl.
USPC ................................. 365/185.24; 365/189.07

(58) Field of Classification Search ............. 365/185.24, 365/189.07
See application file for complete search history.

(56) References Cited

U.S. PATENT DOCUMENTS

| | | | |
|---|---|---|---|
| 4,769,787 A | 9/1988 | Furusawa et al. | |
| 4,797,857 A | 1/1989 | Schreck et al. | |
| 6,373,749 B1 | 4/2002 | Atsumi et al. | |
| 2001/0020718 A1 | 9/2001 | Takahashi et al. | |
| 2006/0104122 A1 | 5/2006 | Choy | |
| 2009/0175081 A1 | 7/2009 | Kim | |

FOREIGN PATENT DOCUMENTS

WO    WO 2006/003383 A2    3/2006

OTHER PUBLICATIONS

Italian Search Report dated Dec. 17, 2010 from corresponding Italian Application No. MI20101081.
Written Opinion dated Dec. 17, 2010 from corresponding Italian Application No. MI20101081.
Italian Search Report dated Dec. 15, 2010 from related Italian Application No. MI20101082.
Written Opinion dated Dec. 15, 2010 from related Italian Application No. MI20101082.

*Primary Examiner* — Ly D Pham
(74) *Attorney, Agent, or Firm* — Wolf, Greenfield & Sacks, P.C.

(57) ABSTRACT

An electrically programmable non-volatile memory device includes a plurality of memory cells, a plurality of lines for selectively biasing the memory cells, reconnection circuitry for reconnecting a pair of selected lines having different voltages, and a controller for controlling the memory device. The reconnection means includes a discharge circuit for discharging one of the selected lines being at the higher voltage in absolute value, an equalization circuit for equalizing the selected lines, a comparator circuit for measuring an indication of a voltage difference between the selected lines, and an evaluation circuit responsive to an enabling signal from the controller for activating the discharge circuit until an absolute value of the voltage difference exceeds a threshold value and for disabling the discharge circuit and enabling the equalization circuit when the absolute value of the voltage difference reaches the threshold value.

10 Claims, 5 Drawing Sheets

NON-VOLATILE MEMORY DEVICE WITH RECONNECTION CIRCUIT

CROSS REFERENCE TO RELATED APPLICATIONS

This application claims the priority benefit of Italian patent application number MI2010A001081, filed on Jun. 30, 2011, entitled NON-VOLATILE MEMORY DEVICE WITH RECONNECTION CIRCUIT, which is hereby incorporated by reference to the maximum extent allowable by law.

BACKGROUND OF THE INVENTION

1. Field of the Invention

The solution according to one or more embodiments of the present invention relates to the electronics field. More specifically, such solution relates to non-volatile memory devices.

2. Discussion of the Related Art

The non-volatile memory devices are used in whatever application that requires the storage of binary digits (or bits) of information that should be retained even when the memory devices are not powered.

Typically, each non-volatile memory device includes a matrix of memory cells, each one of which is provided with several control terminals that are connected to different biasing lines of the matrix; such biasing lines may be biased to different voltage values so as to be able to perform corresponding operations on the selected memory cells (e.g., programming, erasing, reading, checking).

The non-volatile memory devices are usually subject to a high number of operations, with subsequent possible management difficulties of the same; for this reason, typically, the non-volatile memory devices also include a management block (e.g., a microcontroller) within them, which management block is able to manage and synchronize such operations to each other.

However, such an implementation of the non-volatile memory device may have drawbacks such as to preclude use thereof in applications requiring high performance (such as the automotive applications); in particular, the non-volatile memory devices have criticalities under specific operating conditions that require a reconnection between the control terminals of their memory cells.

For example, this may occur if a memory cell is subject to a checking operation of the bit being written in the memory cell after a programming operation being performed on the same. In fact, the programming operation typically requires biasing one of the control terminals to a very high voltage (e.g., 8V) and another of the control terminals to a lower voltage (e.g., 4V), while the checking operation requires that both the control terminals are biased to the same voltage (for example, again 4V); as a consequence, the reconnection between the control terminals (i.e., between the corresponding biasing lines) after the programming operation is necessary to ensure an efficient subsequent checking operation.

However, in most operating conditions the reconnection cannot be performed by short-circuiting the biasing lines to each other (physical or hard reconnection); in fact, in case of high voltage difference between such biasing lines (such as in the example above), an excessive short-circuit current may flow in the non-volatile memory device, thereby causing the breakage thereof.

In the state of the art such operation is typically managed by the microcontroller, which implements a controlled reconnection (called soft reconnection); in particular, as long as the voltage difference between the biasing lines exceeds a predetermined limit value (beyond which the short-circuit current after a hard reconnection would be detrimental for the non-volatile memory device), the microcontroller performs a discharge of the biasing lines, so as to bring them to the same voltage; at this point, the microcontroller can perform an equalization of such biasing lines, i.e., a hard reconnection, without any risk.

However, the reconnection of the biasing lines is performed entirely by the microcontroller through a dedicated algorithm, which is loaded within a working memory thereof. This causes a substantial impossibility of acting on discharge parameters (e.g., a rate thereof). Moreover, such algorithm involves an increase of instructions that the microcontroller needs to perform for implementing the reconnection; this involves a non-negligible waste of time, and ultimately a slowing down of the operation of the non-volatile memory device.

SUMMARY OF THE INVENTION

In its general terms, a solution according to one or more embodiments is based on the idea of implementing an electronic reconnection circuit within the non-volatile memory device.

In particular, one or more aspects of the solution according to specific embodiments are set out in the independent claims, with advantageous features of the same solution that are indicated in the dependent claims (whose wording is enclosed herein verbatim by reference).

More specifically, an aspect of the solution according to an embodiment provides an electrically programmable non-volatile memory device. The memory device includes a plurality of memory cells, a plurality of lines for selectively biasing the memory cells, reconnection means for reconnecting a pair of selected lines having different voltages, and a controller for controlling the memory device. In a solution according to an embodiment, the reconnection means include a discharge circuit for discharging one of the selected lines being at the higher voltage in absolute value, an equalization circuit for equalizing the selected lines, a comparator circuit for measuring an indication of a voltage difference between the selected lines, and an evaluation circuit responsive to an enabling signal from the controller for activating the discharge circuit until an absolute value of the voltage difference exceeds a threshold value and for disabling the discharge circuit and enabling the equalization circuit when the absolute value of the voltage difference reaches the threshold value.

Another aspect of a solution according to an embodiment provides a corresponding reconnection method (with the same advantageous features being recited in the dependent claims for the memory device that apply mutatis mutandis to the method).

BRIEF DESCRIPTION

A solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified)

and that, unless otherwise indicated, they are simply used to conceptually illustrate the described structures and procedures. In particular:

Figure 1:
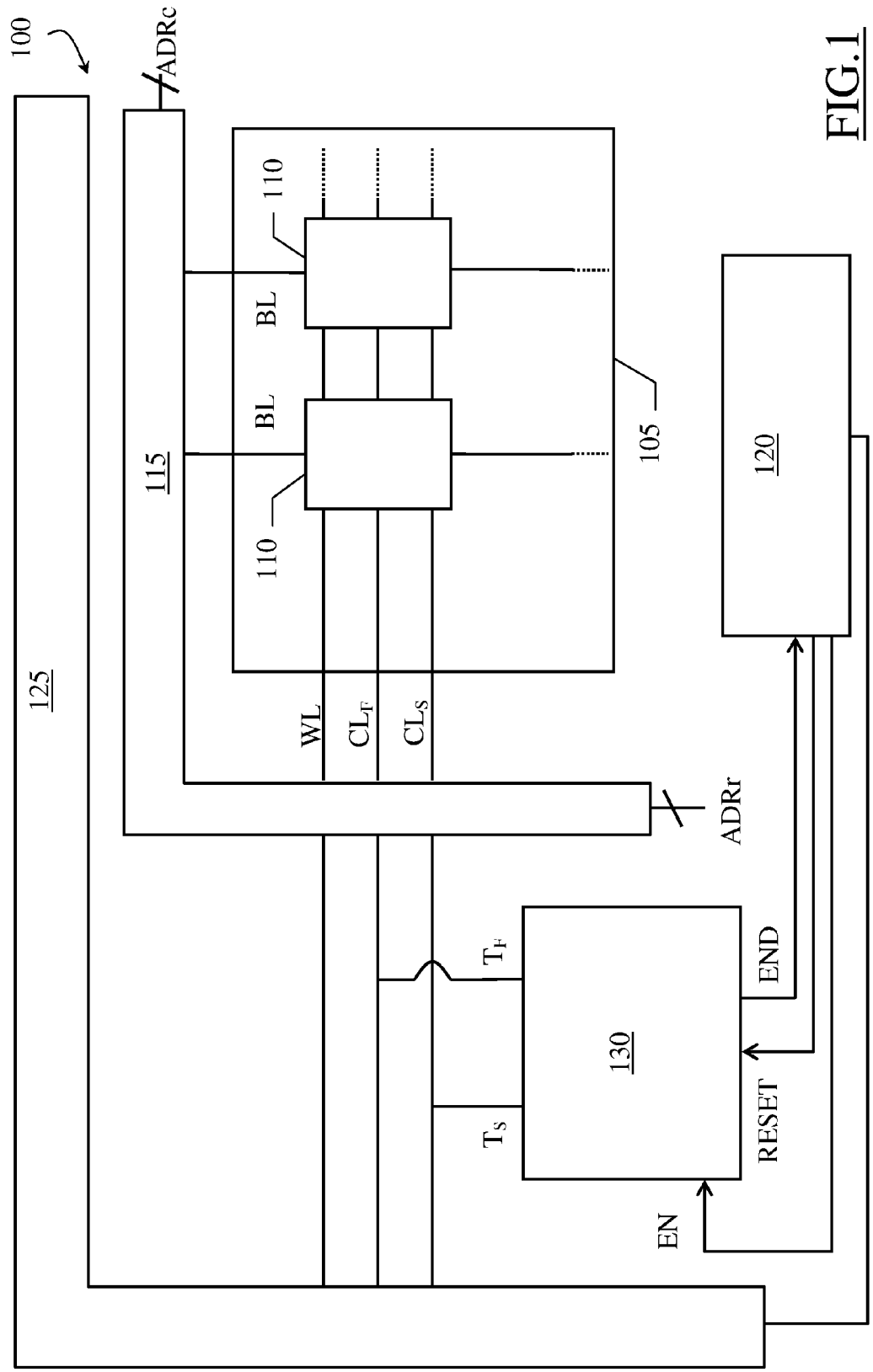
FIG. 1 is a principle block scheme of a non-volatile memory device in which the solution according to an embodiment is applicable.

With particular reference to FIG. 1, there is shown a principle block scheme of a non-volatile memory device 100 in which the solution according to an embodiment is applicable; the non-volatile memory device 100 may be of the FLASH, EPROM, E²PROM type, or the like. The non-volatile memory device 100 includes a memory matrix 105, which is formed by a plurality of memory cells 110 (only two shown in the figure), being arranged in rows and columns (e.g., 128-512 rows and 512-1024 columns). On each memory cell 110 different operations can be performed, and in particular its programming, checking, erasing and reading. In the following, for the sake of exposition brevity and clarity, there will be introduced and described only functional blocks (relevant for the solution according to an embodiment) being directly involved in the programming and checking operations of the memory cells 110.

The matrix 105 includes a plurality of bit lines BL and a plurality of word lines WL, for selecting a row and a column of the matrix 105, respectively. The matrix 105 also includes a plurality of control lines $CL_F$ and a plurality of further control lines $CL_S$; pairs of control lines $CL_F,CL_S$ are connected to respective control terminals (not shown) of the memory cells 110 being used for their biasing according to the operation to be performed thereon. Each memory cell 110 of a same column of the matrix 105 is connected to a same bit line BL, whereas each memory cell 110 of a same row of the matrix 105 is connected to a same word line WL and to a same pair of control lines $CL_F,CL_S$.

The memory cells 110 are selected through a corresponding address being received from the outside of the non-volatile memory device 100, which address is formed by a row address ADRr and a column address ADRc. For this purpose, a selection circuit 115 selects a word line WL, and a pair of control lines $CL_F,CL_S$ according to the row address ADRr, and a group of bit lines BL according to the column address ADRc.

The non-volatile memory device 100 also includes a microcontroller 120, which generally accomplishes management and control functions of the non-volatile memory device 100. The non-volatile memory device 100 also includes a driver circuit 125, which includes all the circuits being used to perform the various operations on the selected memory cells 110 (e.g., biasing circuits, comparators, and so on); in particular, the driver circuit 125, properly enabled by the microcontroller 120, provides (through the selection circuit 115) different driving voltages to the bit lines BL and to the word lines WL (so as to enable each selected memory cell 110), and to the control lines $CL_F,CL_S$, and hence to the control terminals of the corresponding memory cells 110 (for performing the desired operation on each selected memory cell 110). Considering in particular the programming operation of each selected memory cell 110, this implies that its control terminal being associated with the control line $CL_F$ is biased to a very high programming voltage (e.g., $V_{HIGH}$=8V, typically greater than a supply voltage Vdd=2-4V of the non-volatile memory device 100), and that its control terminal being associated with the control line $CL_S$ is biased to a relatively low programming voltage (e.g., $V_{LOW}$=4V). A subsequent checking operation of the same memory cell 110, instead, is performed by biasing such control terminals to a same voltage, being equal to the programming voltage $V_{LOW}$ (so that it is not possible to reconnect the corresponding control lines $CL_F$ and $CL_S$ directly).

For this reason, the non-volatile memory device 100 according to an embodiment further includes a reconnection circuit 130 for reconnecting the control lines $CL_F,CL_S$ of each selected row. The reconnection circuit 130 includes input terminals $T_F,T_S$ each one being connected, respectively, to a pair of control lines $CL_F,CL_S$ being selected by the selection circuit 115; the reconnection circuit 130 also receives an enabling signal EN and an initialization signal RESET from the microcontroller 120, and provides a conclusion signal END to the latter. As described in detail in the following, the reconnection circuit 130 performs a controlled reconnection of its terminals $T_F,T_S$ to the lower voltage in absolute value between them (i.e., the programming voltage $V_{LOW}$ in the example at issue); such operation is performed entirely by the reconnection circuit 130, without any intervention by the microcontroller 120 (once it has been activated).

Such solution is advantageous since it allows reducing a number of instructions that the microcontroller 120 needs to run; this provides a clear gain in terms of speed of the non-volatile memory device 100. Moreover, the use of a dedicated electronic circuit for implementing the reconnection allows making the solution suitable to different types of use, by acting on appropriate electrical parameters.

Figure 2:
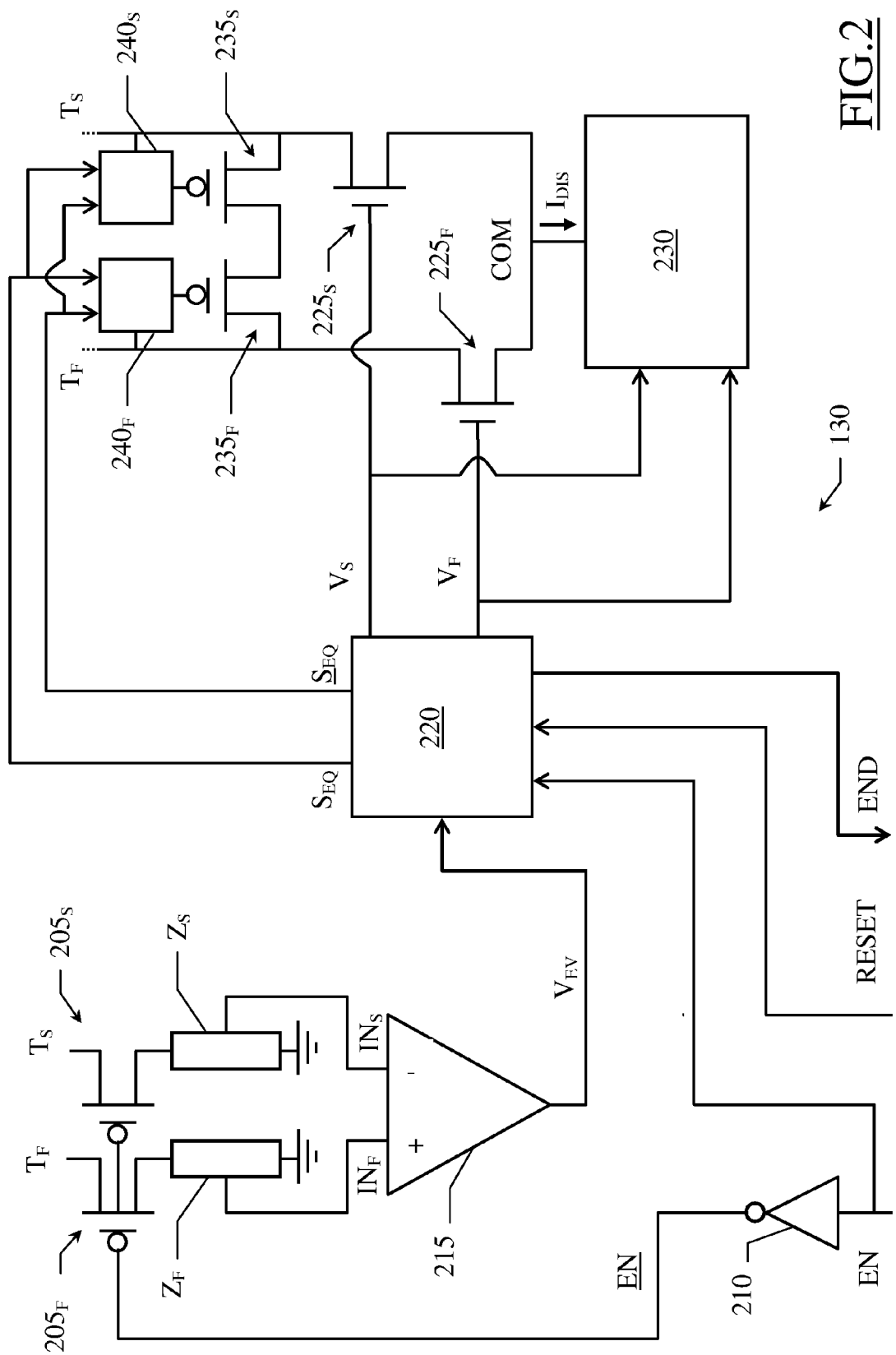
FIG. 2 shows, in terms of functional blocks, a reconnection circuit according to an embodiment.

Turning now to FIG. 2, there is shown, in terms of functional blocks, the reconnection circuit 130 according to an embodiment. The reconnection circuit 130 includes two access transistors $205_F,205_S$ (for example, both of the P-channel MOS type), each one of which includes a source terminal being connected to a respective terminal $T_F,T_S$. The reconnection circuit 130 further includes a logic inverter 210 (for example, of the CMOS type), which is input the signal EN (from the microcontroller, being not shown in the figure) and which outputs a corresponding negated enabling signal EN; such signal EN is provided to gate terminals of both the transistors $205_F,205_S$, in order to control the turning on or turning off thereof.

The reconnection circuit 130 also includes two identical voltage dividers, being represented in the figure as generic functional blocks and indicated by the references $Z_F$ and $Z_S$, each one of which is connected between a drain terminal of a respective transistor $205_F,205_S$ and a terminal providing a ground voltage equal to 0V (or simply ground terminal). For example, the voltage divider $Z_F,Z_S$ can be implemented through a resistive partition network (not shown in the figure), so as to bring both the voltages at the terminals $T_F,T_S$ sufficiently below the supply voltage Vdd to ensure a proper operation of the reconnection circuit 130. The voltage divider $Z_F$ and the voltage divider $Z_S$ include a central tap being connected, respectively, to a non-inverting input terminal (indicated in the figure through the symbol "+") and to an inverting input terminal (indicated in the figure through the symbol "−") of an operational amplifier 215; in this way, each one of such input terminals of the operational amplifier 215 receives a corresponding comparison voltage $IN_F,IN_S$ being obtained by a partition (of a same entity) of the programming voltage ($V_{HIGH}$ or $V_{LOW}$) at the terminal $T_F,T_S$ of the reconnection circuit 130. As visible in the figure, the operational amplifier 215 is in open-loop configuration, and therefore it acts as a comparator with respect to the voltages $IN_F,IN_S$ at its input terminals; the operational amplifier 215 also has an output terminal providing an evaluation signal $V_{EV}$ on the basis of a comparison being performed on the voltages $IN_F,IN_S$.

The reconnection circuit 130 further includes a logic block 220, to which is input the signals EN,RESET (from the microcontroller) and the signal $V_{EV}$, and which outputs a discharge signal $V_F$ and another discharge signal $V_S$ being indicative of the terminal $T_F$ or of the terminal $T_S$, respectively, to be discharged on the basis of the evaluation signal $V_{EV}$. The logic block 220 also outputs an equalization signal $S_{EQ}$ and a corresponding negated equalization signal $\overline{S_{EQ}}$ for enabling the equalization of the terminals $T_F,T_S$, and the signal END (to be provided to the microcontroller).

The reconnection circuit 130 further includes a selection transistor $225_F$ (e.g., of the N-channel MOS type) having a gate terminal that receives the signal $V_F$ and a drain terminal being connected to the terminal $T_F$, and another selection transistor $225_S$ (e.g., of N-channel MOS type too) having a gate terminal that receives the signal $V_S$, and a drain terminal being connected to the terminal $T_S$; a source terminal of the transistor $225_F$ and a source terminal of the transistor $225_S$ are connected to each other thereby defining a common node COM. Such node COM is connected to a discharge block 230, which, enabled by the signals $V_F$ and $V_S$, allows a discharge current $I_{DIS}$ for discharging the corresponding terminal $T_F,T_S$ to flow across the turned-on transistor $225_F,225_S$.

The reconnection circuit 130 also includes an equalization transistor $235_F$ (e.g., of the P-channel MOS type), having a source terminal being connected to the terminal $T_F$, and a further equalization transistor $235_S$ (e.g., of the P-channel MOS type as well) having a source terminal being connected to the terminal $T_S$; a drain terminal of the transistor $235_S$ is connected to a drain terminal of the transistor $235_F$. A gate terminal of the transistor $235_F,235_S$ is connected to an output terminal of a respective voltage elevator block $240_F,240_S$. Each voltage elevator block $240_F,240_S$ is connected to the terminal $T_F,T_S$, and receives the signals $S_{EQ}$ $\overline{S_{EQ}}$ from the logic block 220; in this way, the output terminal of the voltage elevator block $240_F,240_S$ is able to provide, to the gate terminal of the respective transistor $235_F,235_S$, a sufficiently low/high voltage signal to ensure that such transistor $235_F,235_S$ is turned on/off correctly (to this end, it should be noted that in condition of turning off of the transistor $235_F,235_S$, the terminal $T_F,T_S$ which the source terminal of the transistor $235_F,235_S$ is connected to is at a voltage $V_{HIGH}$ being greater than the supply voltage Vdd, thereby the need of the voltage elevator block $240_F,240_S$).

The operation of the reconnection circuit 130 can be summarized as follows.

During the programming operation of a memory cell, the signal EN is at a low logic level (e.g., equal to the ground voltage) and the terminals $T_F,T_S$ are biased at different voltages (in the example at issue, $T_F=V_{HIGH}$ and $T_S=V_{LOW}$). In such condition, the reconnection circuit 130 is operatively decoupled from the terminals $T_F,T_S$, since the signal EN, being at a high logic level (e.g., equal to the supply voltage Vdd) keeps the transistors $205_F,205_S$ turned off; at the same time, the logic block 220 maintains both the signals $V_F$ and $V_S$ at the low logic value (so as to turn off the transistors $225_S$ and $225_F$), and the signal $S_{EQ}$ at the low logic value and the signal $\overline{S_{EQ}}$ at the high logic value (so that the voltage elevator blocks $240_F$ and $240_S$ keep the transistors $235_S$ and $235_F$ turned off).

Once the programming operation has been finished, the microcontroller firstly switches the signal RESET up to the high logic level (so as to initialise the logic block 220, as will be described more in detail in the following) and then the signal EN up to the high logic level; therefore, the signal EN at the low logic level turns on the transistors $205_F,205_S$, so that the voltages at the terminals $T_F,T_S$ are scaled by the respective dividers $Z_F,Z_S$, thereby forming the signals $IN_F, IN_S$ at the input terminals of the comparator 215. Depending on the values of the signals $IN_F,IN_S$, the comparator 215 outputs the signal $V_{EV}$; in particular, the signal $V_{EV}$ is at the high or low logic level depending on whether the signal $IN_F$ is greater or lower than the signal $IN_S$; in other words, the value of the signal $V_{EV}$ depends on a direction of an imbalance (positive or negative, respectively) of a difference between the signals $IN_F,IN_S$. It should be noted that a zero difference between the signals $IN_F,IN_S$ corresponds to a condition being substantially negligible as transitory. Therefore, in the present condition the signal $V_{EV}$ is at the high logic level (since $T_F=V_{HIGH}>T_S=V_{LOW}$).

The logic block 220, being initialized by the initialization signal RESET and activated by the enable signal EN, stores the value of the signal $V_{EV}$, and then switches one of the two signals $V_F,V_S$ to the high logic value according to the terminal $T_F,T_S$ to be discharged (according to the direction of said imbalance as indicated by the value of the signal $V_{EV}$—i.e., the signal $V_F$ in the case at issue). The signal $V_F,V_S$ at the high logic level turns on the corresponding transistor $225_F,225_S$ and the discharge block 230; in this way, the discharge current $I_{DIS}$ discharges the corresponding terminal $T_F,T_S$.

Such discharge continues until the comparator 215 detects the same imbalance direction. As soon as the comparator 215 detects a change in the imbalance direction (when the signal $IN_F,IN_S$, initially greater, reaches and goes down below the other signal $IN_S,IN_F$), the signal $V_{EV}$ switches; this in turn determines the return of the signal $V_F,V_S$ that previously was at the high logic level to the low logic level, so that the corresponding transistor $205_F,205_S$ turns off. At this point the logic block 220 asserts, to the high logic level, the signal END (for indicating the end of the discharge operation) and, in response thereto, the microcontroller switches the signal RESET to the low logic level (so as to decouple the output of the comparator 215 from a part of the logic block 220, as will be explained in the following).

In such condition, the signals $IN_F$ and $IN_S$ (and hence the voltages at the terminals $T_F$ and $T_S$) have almost the same values to each other, and in any case such values are adequate to perform the hard reconnection (short-circuit) of the terminals $T_F,T_S$ without any risk. Therefore, in response to the switching of the signal $V_{EV}$, the logic block 220 asserts the signals $S_{EQ}$ and $\overline{S_{EQ}}$ (at the high logic level and at the low logic level, respectively), so as to cause the turning on of the transistors $235_F,235_S$ by the voltage elevator blocks $240_F, 240_S$. After a prefixed time interval (e.g., 0.5 μs), being sufficient to ensure a complete equalization of the voltages at the terminals $T_F$ and $T_S$, the microcontroller causes the switching of the signal EN down to the low logic level, so that the reconnection circuit 130 returns to its initial condition.

Figure 3A:
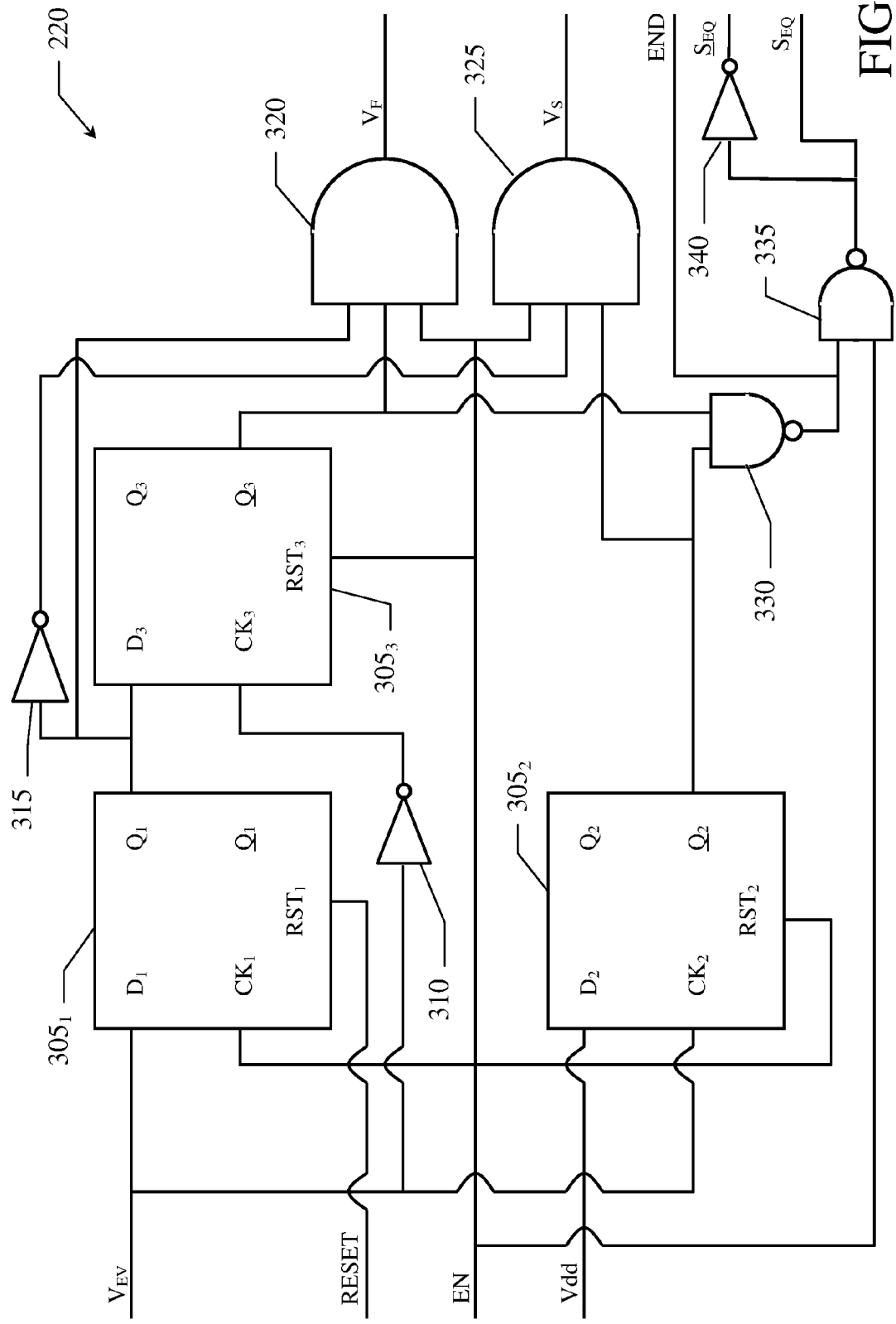
FIG. 3A-3B show a circuit implementation of a logic block of the reconnection circuit of FIG. 2 according to an embodiment and a corresponding trend of some voltages thereof, respectively.
Figure 3B:
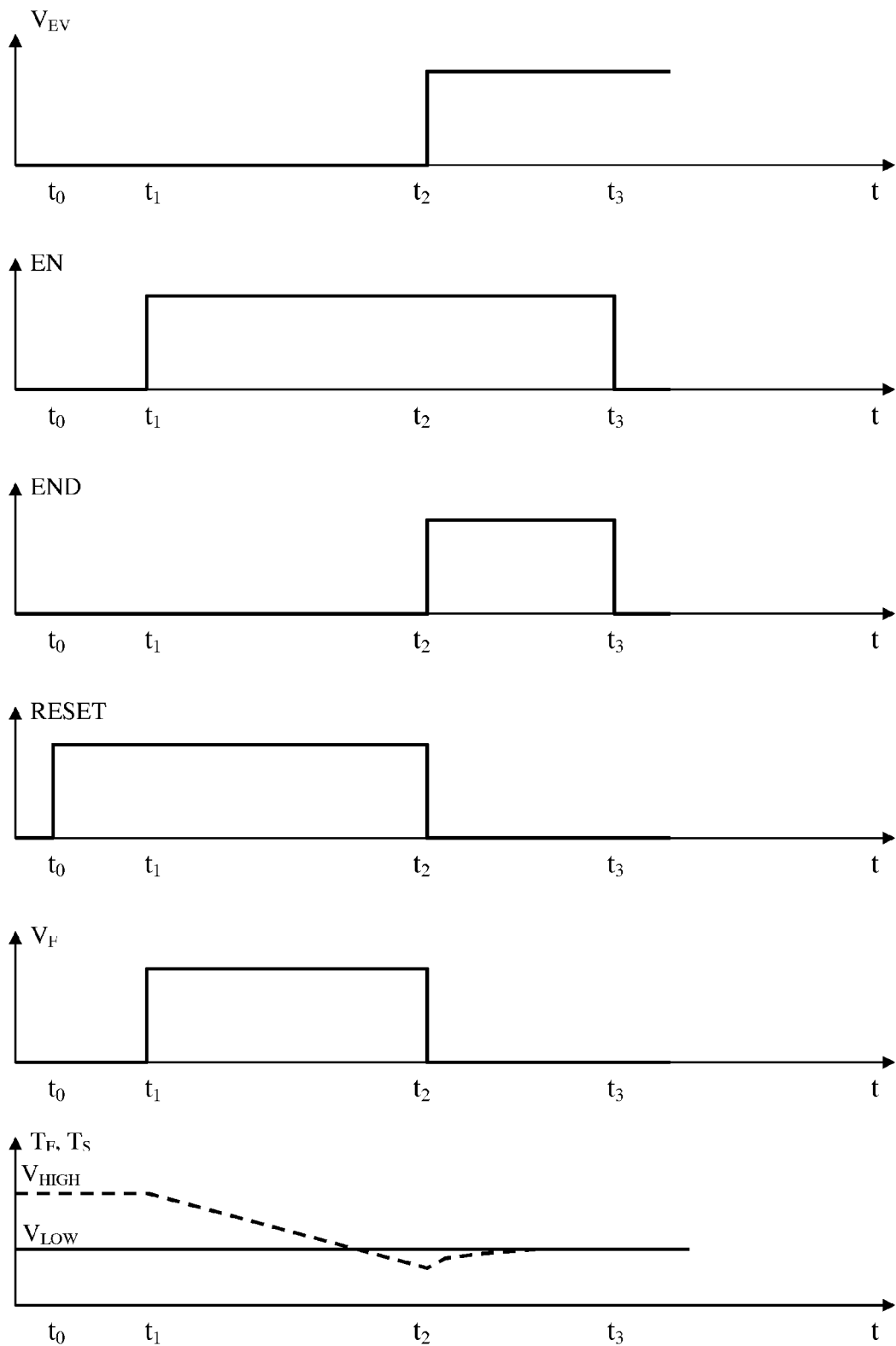

Turning now to FIG. 3A-3B, they show a circuit implementation of the logic block 220 according to an embodiment of the present invention and a corresponding trend of some significant voltages, respectively; more specifically, in FIG. 3B there is shown the trend of the voltages at the terminals $T_F$ and $T_S$ (being indicated with the same references for simplicity), and of the signals $V_{EN}$, EN, END, RESET and $V_F$.

With particular reference to FIG. 3A, the logic block 220 includes a bistable element (or flip-flop) $305_1$, i.e., a memory element being able to store binary data; the flip-flop $305_1$ includes a data terminal $D_1$, a clock terminal $CK_1$, and a reset terminal $RST_1$ for receiving, respectively, the data to be stored, a synchronization signal and a reset signal of the flip-flop, and an output terminal $Q_1$ and a negated output terminal $\overline{Q}_1$ for providing the stored data and the corresponding negated data, respectively. In the exemplary described embodiment, the flip-flop $305_1$ samples the signal being provided to the terminal $D_1$ only during a rising edge of the signal at the terminal $CK_1$ and with the signal at the terminal $RST_1$ at the high logic level. Moreover, the flip-flop $305_1$ is configured in such a way that, on a falling edge of the signal at the terminal $CK_1$, and with the signal at the terminal $RST_1$ at the high logic level, the signals at the terminals $Q_1$ and $\overline{Q}_1$ (being indicated in the following with the same references) do not switch independently of the signal being provided at the terminal $D_1$, whereas when the signal being provided to the terminal $RST_1$ is at the low logic level, the signals $Q_1$ and $\overline{Q}_1$ are forced, respectively, to the low logic value and the high logic value independently of the signals being provided to the terminals $D_1$ and $CK_1$.

The logic block 220 also includes two further flip-flops $305_2$, $305_3$, being analogous to the flip-flop $305_1$, and in which the corresponding input and output terminals (and the respective signals) are indicated with similar references (but differentiated by the subscript 2, i.e., $D_2$, $CK_2$, $RST_2$, $Q_2$ and $\overline{Q}_2$, and by the subscript 3, i.e., $D_3$, $CK_3$, $RST_3$, $Q_3$ and $\overline{Q}_3$, respectively).

The logic block 220 also includes a logic inverter 310 and a further logic inverter 315 (e.g., both in CMOS logic); the logic inverter 310 is input the signal $V_{EV}$ and outputs the corresponding negated signal $\overline{V}_{EV}$, whereas the logic inverter 315 is input the signal $Q_1$ and provides the corresponding negated signal $\overline{Q}_1$.

In the shown implementation, the terminals $D_1$, $D_2$ and $D_3$ receive the signal $V_{EV}$, the supply voltage Vdd and the signal $Q_1$, respectively. Instead, the terminals $CK_1$, $CK_2$ and $CK_3$ receive the signal EN, the signal $V_{EV}$ and the signal $\overline{V}_{EV}$, respectively. Finally, the terminals $RST_1$, $RST_2$ and $RST_3$ receive the signal RESET, the signal EN, and again the signal EN, respectively.

The logic block 220 also includes an AND logic gate 320 having three input terminals and one output terminal, and another AND logic gate 325 being identical to the previous one. The three input terminals of the AND logic gate 320 receive the signal $Q_1$, the signal $Q_3$ and the signal EN, respectively, whereas the output terminal of the AND logic gate 320 provides the signal $V_F$ on the basis of the value of the signals at its input terminals. Instead, the three input terminals of the AND logic gate 325 receive the signal EN, the signal coming from the output of the logic inverter 315 (also corresponding to the signal $\overline{Q}_1$), and the signal $Q_2$, respectively, whereas the output terminal of the AND logic gate 325 provides the signal $V_S$ based on the value of the signals at its input terminals.

The logic block 220 also includes two NAND logic gates 330 and 335 each one having two input terminals and one output terminal, and a further logic inverter 340. The two input terminals of the NAND logic gate 330 receive the signals $Q_2$ and $Q_3$, respectively, while the output terminal provides the signal END. Instead, the two input terminals of the NAND logic gate 335 receive the signal END and the signal EN, respectively, whereas the output terminal provides the signal $S_{EQ}$. The logic inverter 340 is input such signal $S_{EQ}$ and outputs the corresponding negated signal $\overline{S}_{EQ}$.

The operation of the logic block 220 according to the described embodiment can be summarized as follows (with reference to FIG. 3B jointly to FIG. 3A).

During the programming operation, both the signal EN and the signal RESET are at low logic level. Therefore, in such condition, the logic block 220 is operatively decoupled from the input terminals of the reconnection circuit (since the selection transistors are turned off), and the signals $Q_1$,$\overline{Q}_1$ are forced to the low and high logic value, respectively (since the signal RESET is still at the low logic level). In any case, the signal $V_F$,$V_S$ is at the low logic level, since each AND logic gate 320,325, independently of the signals $Q_1$,$Q_2$, $\overline{Q}_1$,$Q_3$, receives the signal EN at the low logic value at one of its input terminals. Meanwhile, the signal END is at the low logic level too, since the NAND logic gate 330 receives the signals $Q_2$ and $Q_3$ at the high logic value (since the signal EN at the input terminals $RST_2$,$RST_3$ is still at the low logic level), while the signal $S_{EQ}$ and the signal $\overline{S}_{EQ}$ are at the high logic level and at the low logic value, respectively.

At the start of the checking operation (time $t_0$=0 μs), the signal $V_{EV}$ is at the high/low logic value (in the example at issue, low) depending on a last value taken in the previous reconnection cycle; at such time $t_0$ the microcontroller switches the signal RESET to the high logic value, so as to initialize the flip-flop $305_1$ predisposing it to receive the signal $V_{EV}$ of the current reconnection cycle at its terminal $D_1$ (in fact, in order for the flip-flop $305_1$ to be able to sample the signal $V_{EV}$, its terminal $RST_1$ should be at the high logic level); since in such condition the signal EN is still at the low logic value, the flip-flop $305_1$ does not change state (since there is no rising edge of the signal at its terminal $CK_1$, i.e., of the signal EN) and neither does the flip-flops $305_2$,$305_3$ (since the respective terminals $RST_1$, $RST_2$ keep on remaining at the low logic value); therefore, the signals $V_F$ and $V_S$ are still at the low logic level, as well as the signal END.

As soon as the microcontroller switches the signal EN up to the high logic value (time $t_1$=0.1 μs), the signal $Q_1$ brings itself to the high or low logic value (in the example at issue, to the high logic value) according to the signal $V_{EV}$ at the terminal $D_1$, so as to store such initial value thereof. The signals $Q_2$ and $Q_3$ instead remain at the high logic value because there is no rising edge of the signal being input to the terminals $CK_2$ and $CK_3$. At this point, according to whether the signal $Q_1$ is at the high or low logic value, the signal $V_F$ or $V_S$ ($V_F$ in the example) switches to the high logic level, respectively, thereby enabling the discharge of the voltage at the terminal $T_F$ or $T_S$ ($T_F$ in the example, indicated with a dotted line in FIG. 3B), respectively; such discharge tends progressively to decrease the voltage imbalance between the input terminals of the reconnection circuit (and hence at the input nodes of the comparator thereof).

As soon as the comparator detects the direction reversal of the voltage imbalance at its input terminals, it causes the switching of the signal $V_{EV}$ (time $t_2$=1.4 μs), which affects only the flip-flop $305_2$ or $305_3$ (according to whether such switching occurs from the high logic level to the low logic level or vice-versa, respectively) and causes the switching of the signal $Q_2$ or $Q_3$ to the low logic level; this determines the switching to the low logic level of the signal $V_F$,$V_S$ being previously at the high logic level (thereby stopping the discharge), and the switching of the signal END to the high logic level, being indicative of the occurred discharge. The microcontroller, thus receiving such signal END, switches the signal RESET to the low logic level; in this way, the flip-flop $305_1$, being not necessary any longer since the discharge phase has finished, is decoupled from the comparator 225, and its signals $Q_1$,$\overline{Q}_1$ are forced back to the low logic value and to the high logic value, respectively (as before of the starting of the checking operation).

The switching of the signal END causes the switching of the signal $S_{EQ}$ and of the signal $\overline{S}_{EQ}$ to the low logic level and to the high logic level, respectively, which switching enables the elevator blocks and the equalization transistors to perform the hard reconnection between the input terminals (of the reconnection circuit) for equalizing the corresponding voltages. Then, at a time $t_3=2$ μs, the microcontroller switches the signal EN to the low logic value (which implies the corresponding switching of the signal END to the low logic level), thus decoupling the logic block again from the input terminals of the reconnection circuit.

At this point, a new reconnection cycle can take place similarly to the previous one.

The solution is advantageous since the logic block 220 operates evenly for both directions of the voltage imbalance between the input terminals of the comparator; therefore, the control line at the higher voltage in absolute value (i.e., the control line to be discharged) can be coupled in an equivalent manner to one of the input terminals of the reconnection circuit; this ultimately provides considerable versatility in the implementation of the reconnection circuit in most non-volatile memory devices.

Figure 4:
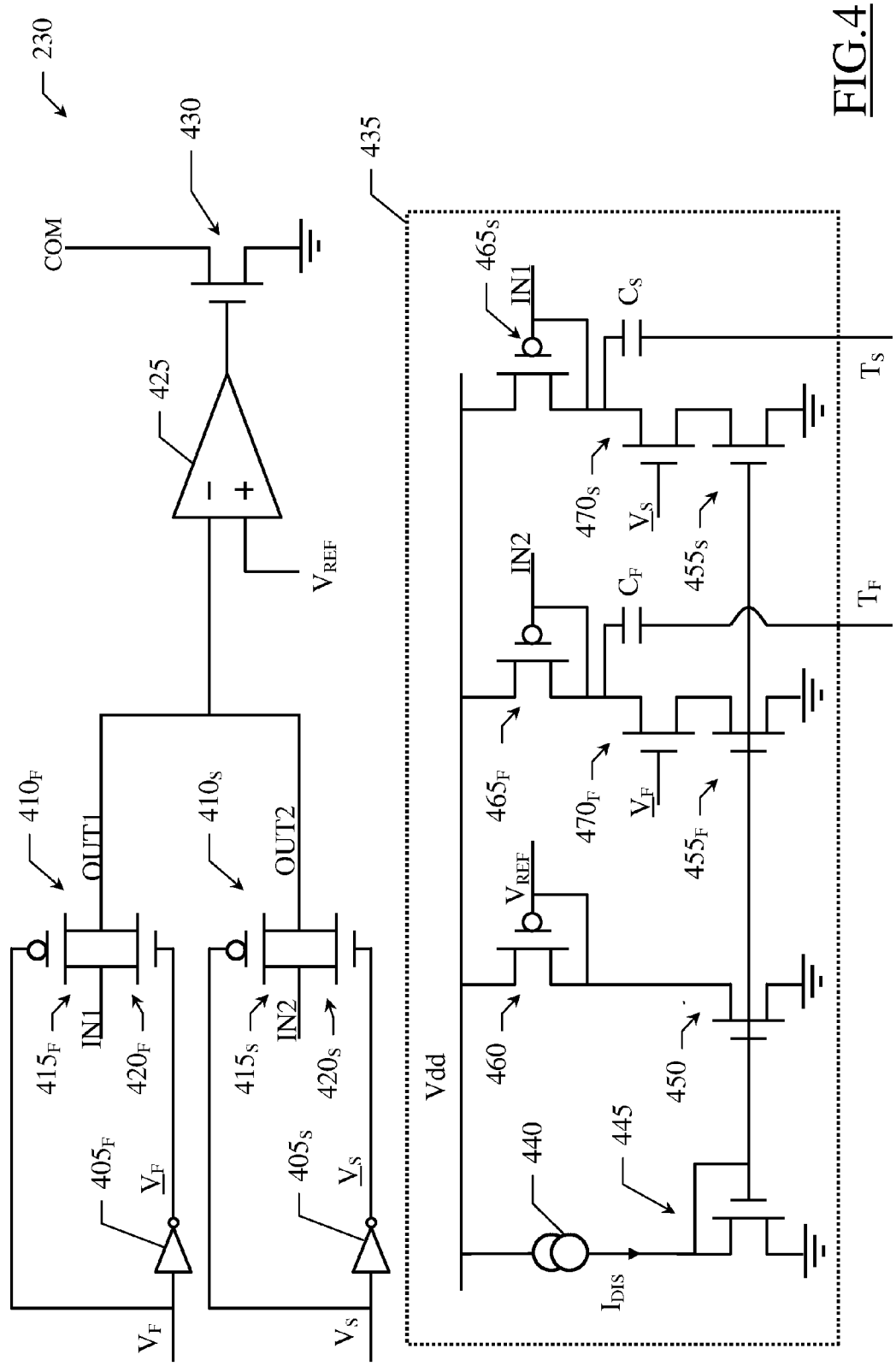
FIG. 4 shows a circuit implementation of a discharge block of the reconnection circuit of FIG. 2 according to an embodiment.

FIG. 4 shows a circuit implementation of the discharge block 230 of the reconnection circuit of FIG. 2 according to an embodiment; in particular, such circuit implementation of the discharge block 230 provides for an electronic circuit for controlling a slew-rate of the discharge.

More specifically, the discharge block 230 includes a logic inverter $405_F$ that is input the signal $V_F$ and outputs the corresponding negated signal $V_F$, and another logic inverter $405_S$ that is input the signal $V_S$ and outputs the corresponding negated signal $V_S$.

The discharge block 230 also includes two transmission ports $410_F,410_S$, each one of which includes, respectively, a transistor (e.g., of the P-channel MOS type) $415_F,415_S$ and another transistor (e.g., of the N-channel MOS type) $420_F$, $420_S$; the transistor $415_F,415_S$ has a source terminal being connected to a drain terminal of the transistor $420_F,420_S$ thereby defining a corresponding input node $IN_1,IN_2$ of the transmission port $410_F,410_S$, and a drain terminal being connected to a source terminal of the transistor $420_F,420_S$ thereby defining a corresponding output node $OUT_1,OUT_2$ of the transmission port $410_F,410_S$. A gate terminal of the transistor $415_F,415_S$ receives the signal $V_F,V_S$, whereas a gate terminal of the transistor $420_F,420_S$ receives the signal $V_F,V_S$.

In this way, each transmission port $410_F,410_S$ is in a configuration known as a transmission gate; such configuration allows enabling or not a transfer of an input voltage $V_{IN1},V_{IN2}$ from the node $IN_1,IN_2$ to the node $OUT_1,OUT_2$ on the basis of the signal $V_F,V_S$ (and of the signal $V_F,V_S$). The nodes $OUT_1$ and $OUT_2$ are both connected to an inverting input (−) of an operational amplifier 425; such operational amplifier 425 receives a reference voltage $V_{REF}$ at a non-inverting input (+) thereof and outputs a turning-on signal (on the basis of a comparison between the voltage being provided to the non-inverting input terminal ($V_{IN1}$ or $V_{IN2}$) and such reference voltage $V_{REF}$), which is provided to a gate terminal of a tail transistor (e.g., of the N-channel MOS type) 430. The transistor 430 has a source terminal being connected to the ground terminal and a drain terminal being connected to the terminal COM (for receiving the current $I_{DIS}$).

The voltages $V_{IN1},V_{IN2}$ and $V_{REF}$ are provided by a biasing circuit 435 being implemented in the discharge block 230. In particular, the biasing circuit 435 includes a direct current generator 440 (of value $I_{DIS}$); the current generator 440 is connected between a terminal providing the supply voltage Vdd (or supply terminal) and a drain terminal of a transistor 445 (e.g., of the N-channel MOS type) in diode-connected configuration; in particular, the transistor 445 has a source terminal being connected to the ground terminal and a gate terminal being short-circuited to its drain terminal.

The biasing circuit further includes three transistors (e.g., of the N-channel MOS type too) $450,455_F,455_S$, each one of which has a source terminal being connected to the ground terminal and a gate terminal being connected to the gate terminal of the transistor 445. In this way, the current generator 440 and the transistors $445,450,455_F$ and $455_S$ define a current mirror; in particular, the current generator 440 and the transistor 445 define a supply branch of the current mirror, whereas the transistors $450,455_F,455_S$ identify corresponding reference branches of the current mirror.

The transistor 450 has a drain terminal being connected to a drain terminal of a transistor (e.g., of the P-channel MOS type) 460 in diode-connected configuration (i.e., with a gate terminal and a drain terminal being short-circuited to each other). A source terminal of the transistor 460 is connected to the supply terminal, whereas the gate terminal is also connected to the non-inverting input terminal of the operational amplifier 425, so as to provide the voltage $V_{REF}$ thereto.

The biasing circuit 435 further includes two transistors $465_F$ and $465_S$ (e.g., of the P-channel MOS type) in diode-connected configuration, being arranged in the reference branch identified by the transistors $455_F$ and $455_S$, respectively; the transistor $465_F,465_S$ has a source terminal being connected to the supply terminal and a gate terminal being connected to the terminal $IN_2,IN_1$ of the transmission port $410_S,410_F$. The biasing circuit 435 also includes two transistors $470_F$ and $470_S$ (for example, of the N-channel MOS type). The transistor $470_F,470_S$ has a drain terminal being connected to the drain terminal of the transistor $465_F,465_S$ and a source terminal being connected to the drain terminal of the transistor $455_F,455_S$; a gate terminal of the transistor $470_F,470_S$ receives the signal $V_F,V_S$ being provided by the respective logic inverter $405_F,405_S$.

Finally, the reference branch being identified by the transistor $455_F,455_S$ includes a capacitor $C_F,C_S$ having a terminal being connected to the drain terminal of the transistor $470_F$, $470_S$ (and therefore to the node $IN_2,IN_1$ of the transmission port $410_S,410_F$) and another terminal being connected to the terminal $T_F,T_S$ of the reconnection circuit.

The operation of the discharge block 220 can be summarized as follows.

In a resting state, the signals $V_F,V_S$ are at the high logic level, so that the transistors $470_F,470_S$ are turned on; therefore, the supply branch 440,445 and the reference branches $450,460,455_F,465_F,470_F$ and $455_S,465_S,470_S$ of the current minor conduct the same current $I_{DIS}$ (with the transistors in the saturation region). Such current $I_{DIS}$, thanks to the sizing of the transistors $450,460,455_F,465_F,470_F$ and $455_S,465_S$, $470_S$, forces the desired values of the voltage $V_{REF}$ (e.g., 3V) and of the voltages $V_{IN1},V_{IN2}$ (being equal to each other, and higher than the voltage $V_{REF}$, e.g., 3.5V), respectively. In such condition, moreover, the transmission ports $410_F,410_S$ are both enabled, so that the respective terminals $IN_1,IN_2$ are short-circuited together, and they are both connected to the inverting terminal of the operational amplifier 425. In such condition, the operational amplifier 425 is in open-loop configuration, and therefore acts as a comparator; in any case, the voltage unbalance being provided to the input terminals of the operational amplifier 425 does not involve any turning on of the transistor 430 (since both the selection transistors, not shown in the figure, between the node COM and the terminals $T_F,T_S$ are turned off), nor any discharge of the terminal $T_F,T_S$.

When one of the signals $V_F,V_S$ switches from the low logic level to the high logic level, the other transmission port $410_F$, $410_S$ is disabled, so that only the input terminal $IN_2,IN_1$ of the transmission port corresponding to the terminal $T_F,T_S$ to be discharged remains connected to the inverting terminal of the operational amplifier 425. Meanwhile, the corresponding selection transistor turns on, enabled by the signal $V_F,V_S$ at the high logic level, which involves the turning on of the transistor 430 too. Moreover, the transistor $470_F,470_S$, controlled by the signal $V_F,V_S$ at the low logic value, turns off; this involves a cut of flow of the current $I_{DIS}$ across the respective transistor $455_F,455_S$, thereby causing substantially a turning off of the corresponding reference branch.

In this way, the operational amplifier 425 is now in a closed-loop configuration; in fact, the transistor $465_F,465_S$ of the turned off reference branch, the corresponding capacitor $C_F,C_S$, the turned on selection transistor, the transistor 430, the operational amplifier 425 and the active transmission port $410_S,410_F$ form a negative feedback loop that allows discharging the terminal $T_F,T_S$.

In particular, the gate terminal of the transistor $465_F,465_S$ of the turned off reference branch is at the voltage $V_{IN2}, V_{IN1}$ such as to create and sustain the current $I_{DIS}$; for this reason, the current $I_{DIS}$, according to well known basic principles of feedback circuits, will flow completely through the transistor $465_F,465_S$ and the capacitor $C_F,C_S$; according to such principles of feedback circuits, moreover, the operational amplifier 425 will have its input terminals at the same reference voltage $V_{REF}$; in this way, the capacitor $C_F,C_S$ conducts a constant current and, at the same time, has a terminal at a fixed voltage being equal to the reference voltage $V_{REF}$ and without current consumption (since it is connected to the inverting input terminal of the operational amplifier 425 exhibiting an ideally infinite impedance); for this reason, any voltage change across the capacitor $C_F,C_S$ due to the current $I_{DIS}$ crossing it, will show itself as a corresponding voltage change of the terminal $T_F,T_S$ (to which the other terminal of the capacitor $C_F,C_S$ is connected), which then is discharged.

In this way, the discharge of the voltage at the terminal $T_F,T_S$ occurs with a speed or slew rate being equal to the ratio between the current $I_{DIS}$ and the capacity value of the capacitor $C_F,C_S$, denoted by the same reference (for example, with $I_{DIS}$=1 μA and $C_F$=CS=1 pF, a slew rate equal to 1V/μs is obtained); such slew rate, thanks to the use of the feedback circuit, is found to be substantially unaffected by parasitic capacitances that, by affecting the terminal $T_F,T_S$, could cause significant fluctuations of the discharge speed.

As soon as the signal $V_F,V_S$ switches to the low logic value (owing to a detection of the occurred discharge), the discharge block 220 returns to the resting condition.

Such solution is particularly advantageous since the discharge speed of the terminal to be discharged is firmly fixed by a negative feedback mechanism, which allows obtaining a discharge time (for a given voltage difference between the two terminals) that is precisely prefixed; as a consequence, also the equalization time is precisely set, since given by a difference between a desired total reconnection time (given by the time wherein the enabling signal EN is at the high logic level) and the discharge time. The ensured high precision of the discharge time provides a high level of automaticity to the reconnection circuit, which involves a significant decrease in the number of operations that the microcontroller has to perform, and hence an improved efficiency of the non-volatile memory device.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

In particular, similar considerations apply if the memory device has a different structure or includes equivalent components (either separated to each other or combined together, in whole or in part); for example, the memory device may include more than one microcontroller, or electronic devices being functionally equivalent thereto (such as microprocessors). Moreover, the above-exposed voltage values should not be construed in a limitative way for the present invention, as they are to be selected, in the design phase, on the basis of topological and circuital, as well as technological and economic considerations.

The selected biasing lines to be reconnected may be in any number, depending on the type of the memory device and/or on an operating principle thereof; in case of more than two lines to be discharged, the reconnection circuit may include different comparators, different discharge circuits, different equalization circuits and/or different logic blocks, being properly synchronized with each other by appropriate additional synchronization signals. In any case, although in the present description explicit reference to the programming and following checking operations has been made, the same solution may be applied in whatever situation wherein it is necessary to reconnect two (or more) lines having different voltages.

The enabling signal being provided by the microcontroller is not limitative to the present invention; for example, such enabling signal may be of the impulsive type or a step signal, of predetermined time (as in the described embodiment) or of a time depending on a reconnection execution time.

The threshold value is not limitative of the present invention, as it may be a parameter being specifically chosen in the design phase, or inherently given by physical and circuital properties of components of the reconnection circuit (such as, for example, a voltage offset of the operational amplifier, or an imbalance of the nodes of the dividers that provide the voltages to the input terminals of the operational amplifier).

Nothing prevents from implementing the slew rate control circuit such as to discharge the line at the higher voltage and simultaneously charge the line at the lower voltage, thereby reducing the time being required to bring the two lines to a same voltage so as to be able to perform the subsequent equalization.

The logic block may include any number of bistable elements, even in different configurations; for example it is also possible to use flip-flops level-triggered at their inputs. Moreover, nothing prevents from using different configurations of logic gates, for example, for reducing parasitic capacitive loads thereby maximizing the transmission speed of the signals within the logic block. In any case, it is also possible to use a simple combinatory network (in case that the voltage imbalance between the two input terminals always has the same direction).

Nothing prevents from implementing the voltage divider through resistive or capacitive partitions networks, or a combination thereof; in any case, it is not excluded the possibility of using variable resistors and/or capacitors, for example, to calibrate the reconnection circuit by eliminating the possible imbalance between the dividers (due, for example, to tolerances of the resistors and/or capacitors)—with such component that can however be omitted when the voltages at issue are of moderate value.

The same considerations apply if each capacitor being included within the slew-rate control circuit and coupled to a corresponding line includes a plurality of elements, properly arranged in series and/or in parallel. Alternatively, it is possible to provide a single capacitor, which can be selectively connected to the biasing line to be discharged through a selection element (e.g., a MOS transistor in pass-transistor configuration). Moreover, nothing prevents from using variable capacitors, so as to allow obtaining, downstream of a production process of the memory device, adjustable discharge speeds.

The current generator is not limitative of the present invention; for example, it may be a current generator being implemented through individual MOS or BJT transistors, or by operational amplifiers (single or in differential configuration), thereby obtaining, depending on the chosen implementation, more or less advantages in terms of area occupation, costs and performance.

The selection transistors may be implemented through individual MOS transistors (as in the case of the described embodiment), or through transistors being arranged in parallel for reducing resistive paths of the discharge current towards the ground terminal.

The same considerations apply if the current minor is implemented in a different manner; for example, nothing prevents from using a Wilson current minor (so as to obtain a high output impedance).

Moreover, the solution according to an embodiment lends itself to be implemented through an equivalent method (by using similar steps, removing some steps being not essential, or adding further optional steps); moreover, the steps may be performed in different order, concurrently or in an interleaved way (at least partly).

It should be readily understood that the proposed structure may be part of the design of an integrated circuit. The design may also be created in a programming language; moreover, if the designer does not manufacture the integrated circuits or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications or microcontrollers).

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electrically programmable non-volatile memory device including a plurality of memory cells, a plurality of lines for selectively biasing the memory cells, reconnection means for reconnecting a pair of selected lines having different voltages, and a controller for controlling the memory device, the reconnection means including a discharge circuit for discharging one of the selected lines being at the higher voltage in absolute value, an equalization circuit for equalizing the selected lines, a comparator circuit for measuring an indication of a voltage difference between the selected lines, and an evaluation circuit responsive to an enabling signal from the controller for activating the discharge circuit until an absolute value of the voltage difference exceeds a threshold value and for disabling the discharge circuit and enabling the equalization circuit when the absolute value of the voltage difference reaches the threshold value.

2. The memory device according to claim 1, wherein the discharge circuit includes a slew-rate control circuit for discharging the selected line being at the higher voltage in absolute value with a fixed rate.

3. The memory device according to claim 1, wherein the evaluation circuit includes means for storing an initial sign of the voltage difference, means for determining the selected line to be discharged according to the initial sign, means for monitoring the sign of the voltage difference, and means for disabling the discharge circuit and enabling the equalization circuit in response to a change of sign of the voltage difference.

4. The memory device according to claim 1, wherein the reconnection mean includes partition means for scaling the voltages at the selected lines in response to the enabling signal, the comparator circuit measuring the scaled voltages.

5. The memory device according to claim 2, wherein the slew-rate control circuit includes capacitive means having a first terminal for coupling to the selected line to be discharged and a second terminal, means for providing a direct discharge current to the second terminal of the capacitive means, and fixing means for holding the second terminal of the capacitive means at a fixed voltage without current absorption.

6. The memory device according to claim 5, wherein the fixing means includes:
a tail transistor having a first conduction terminal, a second conduction terminal for connection to a ground terminal and a control terminal,
means for selectively connecting the selected line to be discharged to the first conduction terminal of the tail transistor,
an operational amplifier having an inverting terminal, a non-inverting terminal for receiving a reference voltage, and an output terminal being connected to the control terminal of the tail transistor, and
means for selectively coupling the selected line to be discharged to the inverting terminal of the operational amplifier.

7. The memory device according to claim 6, wherein the capacitive means includes a pair of capacitive elements each one having a first terminal being connected to a corresponding one of the select lines and a second terminal, and wherein the slew-rate control circuit further includes biasing means for selectively providing the discharge current to the second terminal of the capacitive element being connected to the selected line to be discharged.

8. The memory device according to claim 7, wherein the biasing means includes:
a current mirror having a supply branch for supplying the discharge current, and a service reference branch and a pair of operative reference branches each one for mirroring the discharge current, means for generating the reference voltage from the discharge current being provided by the service reference branch, and connection means for selectively supplying the discharge current from each operative reference branch to a corresponding one of the capacitive elements.

9. The memory device according to claim 8, wherein for each operative reference branch the connection means includes:

a transdiode having a first conduction terminal for connection to a supply terminal and a second conduction terminal being connected to the second terminal of the corresponding capacitive element, and a controlled switch for selectively connecting the second terminal of the corresponding capacitive element to the corresponding operative reference branch.

10. A reconnection method for use in an electrically programmable non-volatile memory device including a plurality of memory cells, a plurality of lines for selectively biasing the memory cells, and a controller for controlling the memory device, wherein for each pair of selected lines the method includes the steps of:

enabling a discharge circuit in response to an enabling signal from the controller, measuring an indication of a voltage difference between the selected lines through a comparator circuit, discharging one of the selected lines being at the higher voltage in absolute value through the discharge circuit until an absolute value of the voltage difference exceeds a threshold value, disabling the discharge circuit and enabling an equalization circuit when the absolute value of the voltage difference reaches the threshold value, and equalizing the selected lines through the equalization circuit.

* * * * *

UNITED STATES PATENT AND TRADEMARK OFFICE
CERTIFICATE OF CORRECTION

| | |
|---|---|
| PATENT NO. | : 8,441,863 B2 |
| APPLICATION NO. | : 13/156356 |
| DATED | : May 14, 2013 |
| INVENTOR(S) | : Maurizio Francesco Perroni et al. |

Page 1 of 1

It is certified that error appears in the above-identified patent and that said Letters Patent is hereby corrected as shown below:

In the Specification:

Col. 13, line 31 should read:
The same considerations apply if the current mirror is Col. 13, line 33 should read:
prevents from using a Wilson current mirror (so as to obtain a Signed and Sealed this
Twenty-fifth Day of June, 2013

Teresa Stanek Rea
*Acting Director of the United States Patent and Trademark Office*